United States Patent
Ha (12)

(10) Patent No.: US 6,718,165 B1
(45) Date of Patent: Apr. 6, 2004

(54) APPARATUS AND METHOD FOR REDUCING NONLINEAR DISTORTION IN AN AUTOMATIC GAIN CONTROL SYSTEM

(75) Inventor: Ji-Won Ha, Seoul (KR)

(73) Assignee: Samsung Electronics Co., Ltd. (KR)

(*) Notice: Subject to any disclaimer, the term of this patent is extended or adjusted under 35 U.S.C. 154(b) by 491 days.

(21) Appl. No.: 09/698,446

(22) Filed: Oct. 27, 2000

(30) Foreign Application Priority Data

Oct. 27, 1999 (KR) .................................. 10-1999-0046847

(51) Int. Cl.[7] .............................. H04B 1/02; H04B 1/10; H04B 15/06
(52) U.S. Cl. ................................ 455/234.2; 455/246.1; 455/250.1; 455/296; 455/127
(58) Field of Search .......................... 455/232.1, 234.1, 455/234.2, 245.1, 245.2, 246.1, 247.1, 250.1, 254, 255, 256, 257, 259, 264, 296, 310, 126, 127; 375/345, 296

(56) References Cited

U.S. PATENT DOCUMENTS 5,001,776 A * 3/1991 Clark ...................... 455/226.2
5,257,283 A   10/1993 Gilhousen et al.
5,991,612 A * 11/1999 Saito ........................ 455/234.1

\* cited by examiner

Primary Examiner—Nguyen T. Vo
(74) Attorney, Agent, or Firm—Dilworth & Barrese, LLP

(57) ABSTRACT

A mobile communication system having an AGC (Automatic Gain Control) function includes an apparatus for adaptively controlling an output level of a local oscillator to reduce nonlinear distortion which may occur when a high-power RF signal is received or when it is necessary to transmit a high-power transmission signal. When a high-power RF signal is applied to a first stage in a receiving stage, the apparatus prevents the signal input to a reception AGC loop from being distorted by decreasing an output level of the local oscillator, which is provided to a down-converter. Further, when the output signal of a transmission stage has a high power level, the apparatus decreases the output level of a transmission AGC amplifier and instead increases the output level of the local oscillator, which is input to an up-converter located in an IF stage, so that it is possible to obtain a nonlinear distortion-reduced signal while obtaining the same output level.

17 Claims, 2 Drawing Sheets

APPARATUS AND METHOD FOR REDUCING NONLINEAR DISTORTION IN AN AUTOMATIC GAIN CONTROL SYSTEM

PRIORITY

This application claims priority to an application entitled "Apparatus and Method for Reducing Nonlinear Distortion in an Automatic Gain Control System" filed in the Korean Industrial Property Office on Oct. 27, 1999 and assigned Serial No. 99-46847, the contents of which are hereby incorporated by reference.

BACKGROUND OF THE INVENTION

1. Field of the Invention

The present invention relates generally to a mobile communication system, and in particular, to an apparatus and method for reducing nonlinear distortion in a system having an automatic gain control function.

2. Description of the Related Art

In general, a mobile communication system has an automatic gain control (AGC) function to automatically control a gain of a transceiver depending on a power level of a received signal. During transmission, the mobile communication system with the AGC function (hereinafter, referred to as an AGC system) properly controls a gain of a transmission power amplifier to transmit signals at a proper transmission power level in response to a transmission power control command uniquely transmitted to each mobile station from a base station in order to prevent performance degradation of the system due to interference with other mobile station users. During reception, the AGC system properly controls a gain of a receiving amplifier to compensate for a fading phenomenon which is a time-dependent variation of reception power due to a variation in the distance from the base station and the movement of vehicles or pedestrians.

FIG. 1 illustrates a structure of an AGC system according to the prior art, which is disclosed in U.S. Pat. No. 5,257, 283, entitled "Spread Spectrum Transmitter Power Control Method and System".

Referring to FIG. 1, a signal received from an antenna is applied to an intermediate frequency amplifier (IF AMP) 94 through a down-converter 90 and a bandpass filter (BPF) 92. The output of the IF amplifier 94 is applied to a baseband processor 108 through an analog-to-digital (A/D) converter 106 and is also applied to an AGC detector 96. The AGC detector 96 has two different uses, as follows:

(1) During reception, the AGC detector 96 generates a control voltage for controlling a gain of the IF amplifier 94 to maintain a level of the received signal.

(2) During transmission, the output of the AGC detector 96 is compared with a reference power level value generated by a control processor 110 in order to adjust transmission power to a value set by a mobile station power control command transmitted from the base station. The reference power level value is applied to a comparator 98 through a digital-to-analog (D/A) converter 112. The output of the comparator 98 is applied to a nonlinear filter 100, the output of which is non-linearly varied according to a variation rate in the output of the comparator 98. The nonlinear filter 100 has the function of setting an increasing rate of a transmission power control voltage to be less than a decreasing rate thereof in order to prevent performance degradation of the system due to an abrupt increase in the transmission power. In addition, during a transmission mode of the mobile station, an IF amplifier 104 controls a signal received from a transmission modulator (not shown) depending on a control signal generated from the control processor 110. Here, a D/A converter 114 is required to generate a control voltage for controlling a gain of the IF amplifier 104. An output signal of the IF amplifier 104 is applied to an IF amplifier 102 which also receives the output of the nonlinear filter 100. In this manner, the AGC system enables automatic gain control during transmission.

In the AGC system shown in FIG. 1, when a high-power input signal is applied to a first stage in a receiving stage, several elements located in an RF (Radio Frequency) stage are saturated causing nonlinear distortion of the received signal. Finally, this distorted signal is applied to an AGC loop, and when the baseband signal is demodulated in a modem, clipping distortion is further added to the distorted signal by the AGC loop, causing degradation of demodulation performance. The same problems occur even during a transmission mode. That is, if transmission power is controlled using only the transmission AGC amplifier when increasing the transmission power, the RF elements in the next stage can be easily saturated due to the high power of the AGC amplifier in the transmission stage. Therefore, for the high-power reception and transmission signals, it is necessary to reduce distortion of the signals input to and output from the AGC loop; otherwise the nonlinearly-distorted signals input to and output from the AGC loop are transmitted to the next stage, causing degradation of the overall system performance.

Of course, when it is necessary to transmit a high-power signal by providing the nonlinear filter 100 in the transmission stage as shown in FIG. 1, it is possible to prevent the AGC amplifier in the transmission stage from being saturated. However, it is not so easy to realize such a nonlinear filter 100 having the proper features. Moreover, in order to control a gain of the IF amplifier 102, an additional circuit is required to convert the output level of the nonlinear filter 100 to a gain varying control voltage for the IF amplifier 102. Also, it is not easy to construct such a level conversion circuit because of the nonlinear characteristics of the nonlinear filter 100.

SUMMARY OF THE INVENTION

It is, therefore, an object of the present invention to provide an apparatus and method for reducing nonlinear distortion of transmission/reception signals in an AGC system.

It is another object of the present invention to provide an apparatus and method for preventing a signal input to an AGC loop in a receiving stage from being distorted by an RF stage when a high-power input signal is applied to a first stage of the receiving stage in an AGC system.

It is yet another object of the present invention to provide an apparatus and method for preventing a signal output from an AGC loop in an IF stage from being distorted, when an output signal of a transmission stage has a high power level in an AGC system.

It is still another object of the present invention to provide an apparatus and method for preventing RF elements from being saturated for high-power transmission/reception signals in an AGC system.

It is still another object of the present invention to provide an apparatus and method for preventing degradation of system performance for the high-power transmission/reception signals in an AGC system.

To achieve the above objects, an apparatus for adaptively controlling an output level of a local oscillator is provided to reduce nonlinear distortion which may occur when receiving a high-power RF signal or when it is necessary to transmit a high-power transmission signal. When a high-power RF signal is applied to a first stage of the receiving stage, the apparatus prevents the signal input to a reception AGC loop from being distorted by decreasing an output level of the local oscillator being provided to a down-converter. Further, when the output signal of a transmission stage has a high power level, the apparatus decreases the output level of a transmission AGC amplifier to some extent and instead, increases the output level of the local oscillator being input to an up-converter located in an IF stage so that it is possible to obtain a nonlinear distortion-reduced signal while obtaining the same output level. As a result, the invention expands the linear operation region of the transmission/reception AGC loop, so that it is possible to prevent degradation of the system performance resulting from the limitation on the linear operation region of the AGC loop due to nonlinear distortion.

According to a first aspect of the present invention, an apparatus is provided for reducing nonlinear distortion occurring in a down-converter according to a level of a received RF signal in a receiving stage of a mobile communication system including a low-noise amplifier for low-noise amplifying an RF input signal received through an antenna and outputting the received RF signal, said down-converter for down-converting the received RF signal to an IF signal by mixing the received RF signal with a reference frequency signal, and an AGC amplifier for amplifying the IF signal according to an AGC voltage to maintain power of the IF signal and outputting the amplified signal for demodulation. The apparatus includes a power detector for detecting power of the received RF signal; a comparator for comparing the detected received RF signal with a predetermined reception power threshold and generating a comparison control voltage being inversely proportional to a difference therebetween; and a voltage controlled amplifier for amplifying the reference frequency signal according to the generated comparison control voltage and outputting the amplified reference frequency signal to the down-converter.

According to a second aspect of the present invention, an apparatus is provided for reducing nonlinear distortion occurring in an AGC amplifier due to an increase in gain thereof when a power level of a transmission signal is high in a transmission stage of a mobile communication system including the AGC amplifier for amplifying an IF transmission signal according to a transmission signal power level control voltage to maintain power of modulated transmission signal, an up-converter for mixing an output signal of the AGC amplifier with a reference frequency signal to up-convert the IF signal to an RF signal, and a power amplifier for power amplifying the RF signal and transmitting the amplified RF signal. The apparatus includes a comparator for comparing the transmission signal power level control voltage with a predetermined transmission power threshold and generating a comparison control voltage being inversely proportional to a difference therebetween; and a voltage controlled amplifier for amplifying the reference frequency signal according to the generated comparison control voltage and outputting the amplified reference frequency signal to the up-converter.

According to a third aspect of the present invention, there is provided an apparatus for reducing nonlinear distortion of transmission/reception signals in a mobile communication system having an AGC function. The apparatus includes an oscillator for oscillating a reference frequency signal; a low-noise amplifier for low-noise amplifying an RF input signal received through an antenna and outputting a received RF signal; a power detector for detecting power of the received RF signal; a first comparator for comparing the detected power of the received RF signal with a predetermined reception power threshold and generating a reception comparison control voltage being inversely proportional to a difference there between; a first voltage controlled amplifier for amplifying the reference frequency signal according to the reception comparison control voltage; a down-converter for mixing the received RF signal with an output of the first voltage controlled amplifier to convert the received RF signal to an IF signal; a reception AGC amplifier for amplifying the IF signal according to an AGC voltage to maintain power of the IF signal and outputting the amplified signal for demodulation; a controller for determining the reception power threshold, a transmission power threshold and a transmission signal power level control voltage; a transmission AGC amplifier for amplifying the demodulated transmission signal according to the transmission signal power level control voltage to maintain power of the demodulated transmission signal; a second comparator for comparing the transmission signal power level control voltage with the transmission power threshold and generating a transmission comparison control voltage being inversely proportional to a difference there between; a second voltage controlled amplifier for amplifying the reference frequency signal according to the transmission comparison control voltage; an up-converter for mixing an output of the transmission AGC amplifier with an output of the second voltage controlled amplifier to convert the output signal of the transmission AGC amplifier to an RF transmission signal; and a power amplifier for power amplifying the RF transmission signal and transmitting the amplified transmission signal through the antenna.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

The invention reduces the nonlinearity of a signal input to an AGC loop by previously controlling a nonlinearity of a prior RF stage for the high-power reception signal, since it is not possible for the AGC loop to remove the nonlinearity included in the signal. Further, since an excessive increase in a gain of the transmission AGC amplifier may cause considerable nonlinear distortion at an output of the transmission AGC amplifier for the high-power transmission signal, the invention decreases an output signal of the transmission AGC amplifier to prevent nonlinear distortion of the transmission AGC amplifier and instead, relatively increases an output power level of a local oscillator in an IF stage, so that the same transmission power can be transferred to the following stage.

Figure 1:
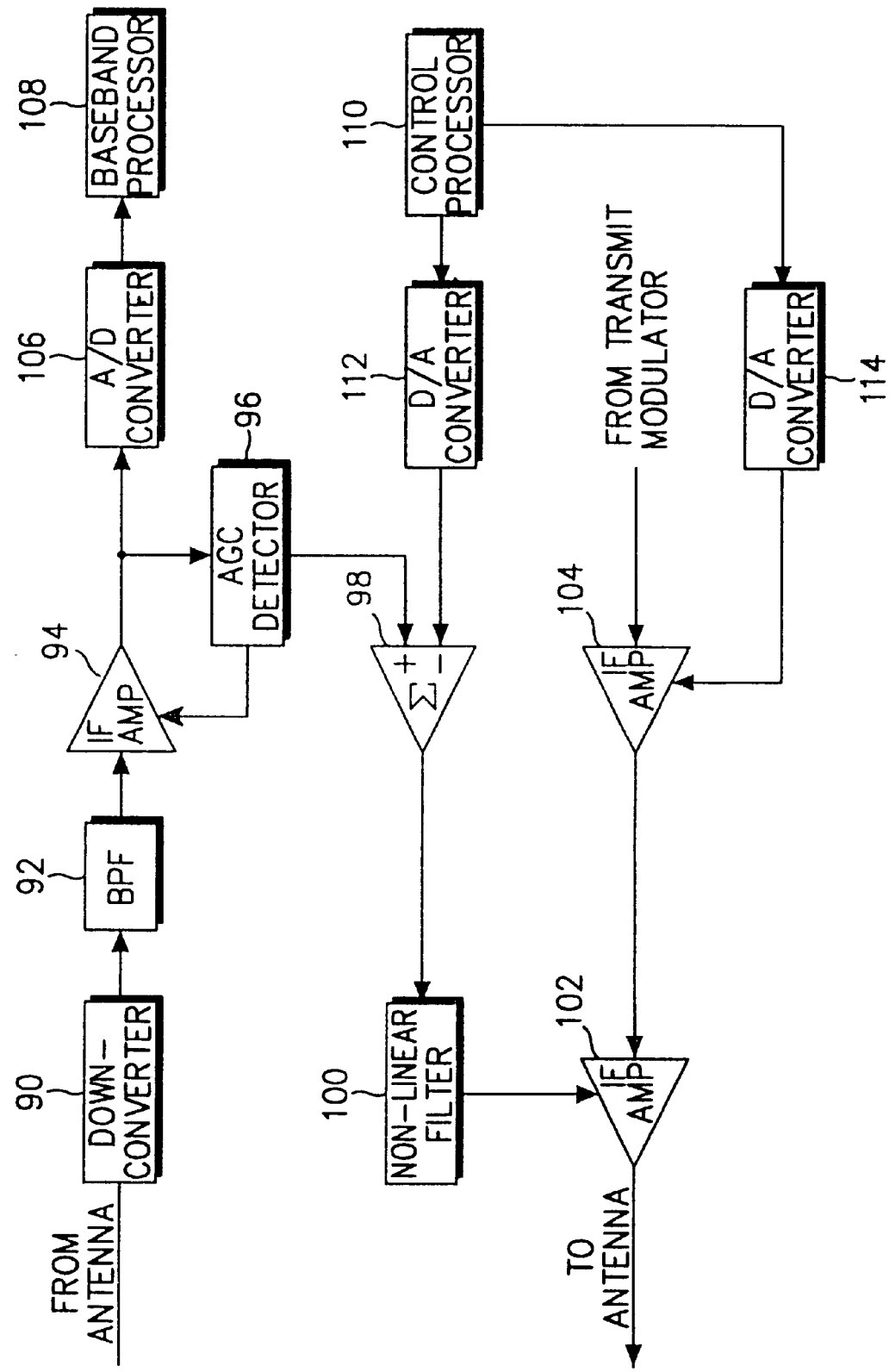
FIG. 1 is a block diagram illustrating an apparatus for reducing nonlinear distortion in an AGC system according to the prior art.
Figure 2:
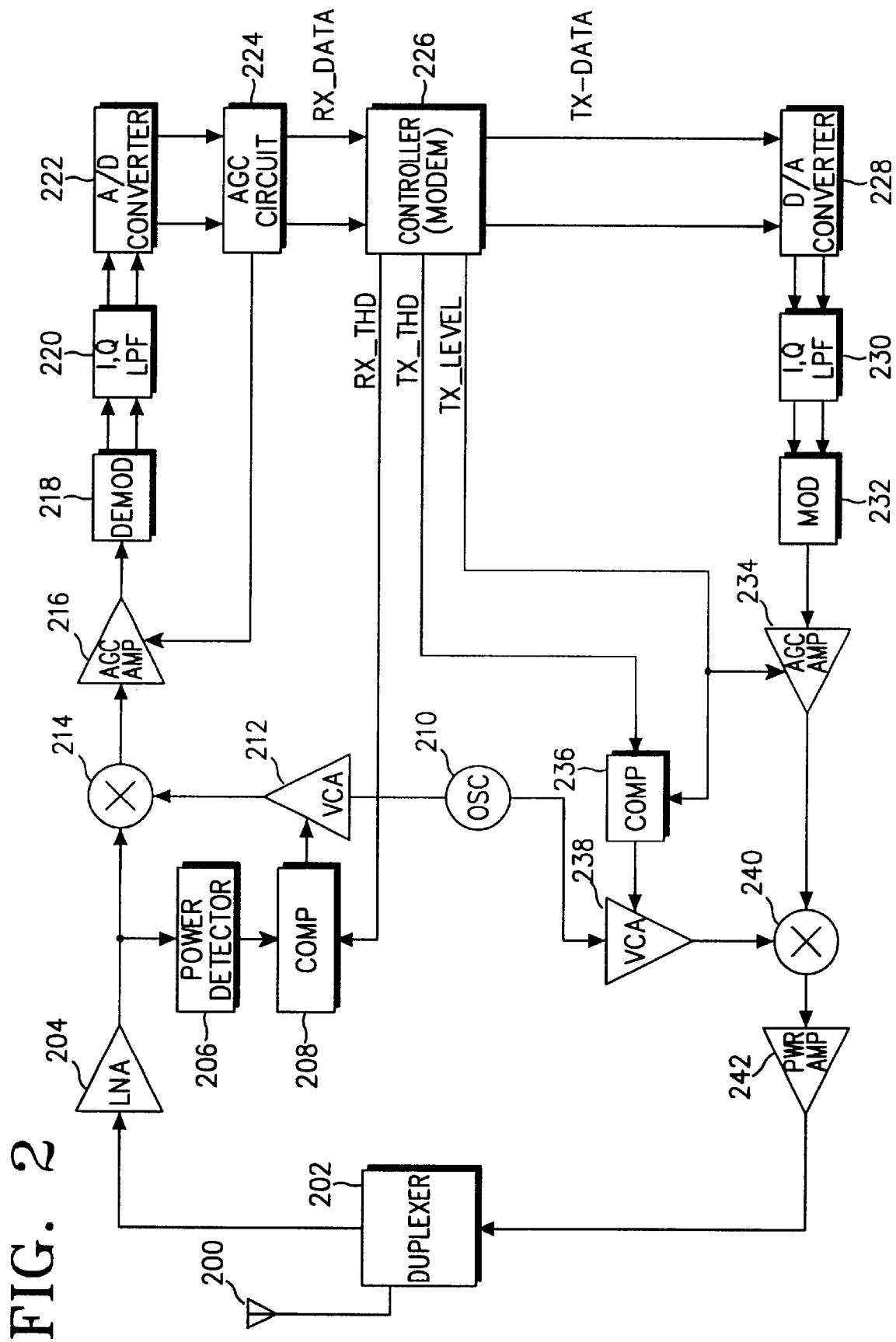
FIG. 2 is a block diagram illustrating an apparatus for reducing nonlinear distortion in an AGC system according to an embodiment of the present invention.

FIG. 2 illustrates a structure of an apparatus for reducing nonlinear distortion which may occur in an AGC system, according to an embodiment of the present invention.

Referring to FIG. 2, an RF signal received through an antenna 200 is split by a duplexer 202, which splits a transmission frequency signal from a reception frequency signal, and then applied to a low-noise amplifier (LNA) 204. The low-noise amplifier 204 low-noise amplifies the received signal split by the duplexer 202 and applies the low-noise amplified signal to a down-converter 214 and a power detector 206. The power detector 206 detects (measures) power of the low-noise amplified signal and provides a specific value being proportional to the detected power of the received signal to a comparator 208. The comparator 208 is also provided with a reception power threshold RX_THD from a controller (or modem) 226. The comparator 208 compares the two values and applies the comparison result (i.e., a difference between them) to a control voltage input terminal of a voltage controlled amplifier (VCA) 212. Here, the value applied from the comparator 208 to the voltage controlled amplifier 212 is a comparison control voltage which is inversely proportional to the difference between the power of the received signal and the reception power threshold RX_THD. The voltage controlled amplifier 212 receives a reference frequency signal oscillated by a local oscillator (OSC) 210 and amplifies the received reference frequency signal according to the comparison control voltage output from the comparator 208. That is, the comparator 208 generates the comparison control voltage when the power of the received signal is equal to or greater than the reception power threshold RX_THD, and the voltage controlled amplifier 212 decreases a power level of the reference frequency signal oscillated by the local oscillator 210 in response to the comparison control voltage.

The down-converter 214 mixes the output signal of the low-noise amplifier 204 with the output signal of the voltage controlled amplifier 212. A signal output from the down-converter 214 is an IF signal converted from the RF signal. A reception AGC amplifier 216 controls the output signal of the down-converter 214 according to an automatic gain control (AGC) voltage provided from an AGC circuit 224, to maintain the power level of the received signal. The output signal of the reception AGC amplifier 216 is applied to a demodulator 218 where it is demodulated into I-channel and Q-channel baseband signals. A low-pass filter (LPF) 220 low-pass filters the demodulated I-channel and Q-channel baseband signals. The low-pass filtered I-channel and Q-channel baseband signals are applied to the AGC circuit 224 for performing an AGC algorithm, through an A/D converter 222. The I-channel and Q-channel data RX_DATA automatic-gain-controlled by the AGC circuit 224 is applied to the controller (or modem) 226. The AGC circuit 224 generates the automatic gain control voltage of AGC amplifier 216 for maintaining the power level of the received signal.

The controller 226 is provided with the received data RX_DATA from the AGC circuit 224, and outputs transmission data TX_DATA to a D/A converter 228. Further, the controller 226 determines the reception power threshold RX_THD, a transmission power threshold TX_THD and a transmission signal power level control voltage value TX_LEVEL, and provides them to the comparator 208, the comparator 236, and a transmission AGC amplifier 234, respectively.

The reception power threshold RX_THD is a power level at which bit error rate (BER) performance is deteriorated. The RF signal received through the antenna 200 is finally output through the A/D converter 222, and an RF signal having a power level higher than the distorted RF signal output from the A/D converter 222 may deteriorate the BER performance. Therefore, the present invention previously sets a threshold of the RF signals, where distortion occurs, to the reception power threshold RX_THD, and increases a power level of the received reference frequency signal being provided to the down-converter 214, when an RF signal having a power level greater than the RX_THD is received, so that a nonlinear distortion-removed signal is applied to the AGC stage.

The transmission signal power level control voltage value TX_LEVEL is provided to the AGC amplifier 234 from the controller 226 in order to transmit the automatic gain-controlled transmission signal having a constant power level, and is determined based on the received signal. Among the transmission signals output from the AGC amplifier 234, a transmission signal of over a certain power level can be distorted when transmitted through the RF stage, and the transmission power threshold TX_THD is used to remove such distortion. Therefore, the invention compares the transmission signal power level control voltage value TX_LEVEL for determining the transmission signal power level with the transmission power threshold TX_THD, which is the threshold where the transmission signal may be distorted. As a result, when the control voltage value TX_LEVEL is greater than or equal to the threshold TX_THD, the invention decreases the output level of the AGC amplifier 234 and instead, increases the level of the transmission reference frequency being applied to the down-converter 214, to thereby remove the nonlinear distortion signal from the output signals of the AGC stage.

During a transmission operation, the controller 226 outputs the I-channel and Q-channel transmission data TX_DATA to the D/A converter 228. The D/A converter 228 converts the transmission data TX_DATA to analog transmission signals. A low-pass filter (LPF) 230 low-pass filters the analog transmission signals. A modulator 232 modulates the transmission signal low-pass filtered by the LPF 230, and outputs the modulated transmission signal to the AGC amplifier 234. The AGC amplifier 234 amplifies the output of the modulator 232 according to the transmission signal power level control voltage value TX_LEVEL provided from the controller 226. The signal output from the AGC amplifier 234 has a constant power level and is applied to an up-converter 240.

The comparator 236 compares the transmission power threshold TX_THD with the transmission signal power level control voltage value TX_LEVEL from the controller 226, and applies a comparison control voltage being inversely proportional to the comparison result (i.e., the difference between them) to a voltage controlled amplifier 238. The voltage controlled amplifier 238 receives the reference frequency signal oscillated by the local oscillator 210, amplifies the received reference frequency signal according to a signal corresponding to the comparison control voltage provided from the comparator 236, and outputs the amplified signal to the up-converter 240. That is, the comparator 236 generates the comparison control voltage when the transmission signal level power control voltage value TX_LEVEL for determining the power of the transmission signal is larger than or equal to the transmission power threshold TX_THD, and the voltage controlled amplifier 238 increases the level of the reference frequency signal oscillated by the oscillator 210 in response to the comparison control voltage level.

The up-converter 240 mixes the output signal of the AGC amplifier 234 with the output signal of the voltage controlled amplifier 238. The signal output from the up-converter 240 is an RF signal converted from the IF signal. A power amplifier 242 amplifies the RF signal output from the up-converter 240. The RF signal power-amplified by the power amplifier 242 is transmitted via the duplexer 202 and the antenna 200.

A detailed description will be made of an operation performed by the nonlinear distortion reducing apparatus of FIG. 2 according to an embodiment of the present invention.

Now, it will be assumed that the signal received through the antenna 200 is applied to the low-noise amplifier 204 through the duplexer 202. The low-noise amplifier 204 low-noise amplifies the received signal. The output of the low-noise amplifier 204 is applied to the power detector 206 where power of the received RF signal is measured, and the measured power value is applied to the comparator 208. When the received RF signal has a high power level, the output of the low-noise amplifier 204 may be saturated causing nonlinear distortion of the received signal. The output of the low-noise amplifier 204 is applied to the down-converter 214 in which the nonlinear distortion further occurs increasing distortion of the signal. In this case, the signal applied to the AGC amplifier 216 is distorted, and this distorted signal is further distorted while passing through the AGC amplifier 216 which serves as a clipper for the high-power input signal. Therefore, it is necessary to prevent the signal input to the AGC amplifier 216 from being distorted. That is, when the output signal of the low-noise amplifier 204 has a high power level, the value output from the power detector 206 is increased. The comparator 208 compares the reception signal power value output from the power detector 206 with the reception power threshold RX THD provided from the controller 226, and applies the comparison result to the voltage controlled amplifier 212 as the comparison control voltage. The voltage controlled amplifier 212 then adaptively controls the output level of the oscillator 210, being applied to the down-converter 214.

A method for setting the reception power threshold RX_THD provided to the comparator 208 is as follows. When the high-power signal is input to the first stage in the receiving stage, the signal finally passed through the A/D converter 222 is considerably distorted, causing degradation of the BER performance in the controller 226. Therefore, the output level of the power detector 206, where the BER performance is deteriorated, is previously set to the reception power threshold, and the BER of the presently received data is measured to apply the corresponding threshold to the comparator 208 as the reception power threshold RX_THD. The comparator 208 then compares the reception power threshold RX_THD from the controller 226 with the reception signal power output value of the power detector 206. The comparator 208 generates a voltage for controlling the voltage controlled amplifier 212, only when the output value of the power detector 206 is greater than or equal to the reception power threshold RX_THD. This is because when the output of the power detector 206 is greater than or equal to the reception power threshold RX_THD, the received RF signal has a very high level, so that it is possible to control the output power level of the down-converter 214, being applied to the AGC amplifier 216, by decreasing the output power level of the oscillator 210 under the control of the voltage controlled amplifier 212. For reference, a gain of the down-converter 214 depends on the output level of the oscillator 210.

For the high-power transmission signal, a process for controlling the transmission AGC amplifier 234 may also be described in the same manner.

Among the output signals of the controller 226, the transmission signal power level control voltage value TX_LEVEL for controlling the transmission AGC amplifier 234 is input to the control voltage terminal of the AGC amplifier 234. The IF signal output from the AGC amplifier 234 is converted to the RF signal by the up-converter 240. The up-converter 240 also receives the output of the voltage controlled amplifier 238, obtained by amplifying the output of the oscillator 210. The control voltage output from the voltage controlled amplifier 238 depends on the comparison between the transmission power threshold TX_THD generated by the controller 226 and the control voltage TX_LEVEL for the transmission AGC amplifier 234, determined based on the received signal. Here, the transmission power threshold TX_THD generated from the controller 226 is set as follows.

If the gain of the transmission AGC amplifier 234 is highly increased in order to increase the power of the transmission signal to a very high level, the output signal is distorted to some extent. In this case, the apparatus decreases the gain of the AGC amplifier 234 to the original value and instead, increases the output level of the oscillator 210, being applied to the up-converter 240 to control the output level of the up-converter 240. As a result, even though the AGC amplifier 234 has the high gain, the output level of the up-converter 240 remains constant, and at the same time, it is possible to reduce the nonlinear distortion occurring in the AGC amplifier 234.

As described above, in the mobile communication system, the novel apparatus of the present invention adaptively controls the output level of the local oscillator located in an RF stage to prevent the signal input to the AGC loop in the receiving stage from being distorted when the input signal of the first stage in the receiving stage has a high level. In addition, when the output signal of the transmission stage has a high level, the novel apparatus decreases the output of the transmission AGC amplifier and instead, increases the output level of the local oscillator input to the up-converter located in the IF stage, so that it is possible to obtain a nonlinear distortion-reduced signal while obtaining the same output level. As a result, the invention has the result of expanding the linear operation region of the transmission/reception AGC loop, so that it is possible to prevent degradation of the system performance because of the limitation on the linear operation region of the AGC loop due to the nonlinear distortion.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for reducing nonlinear distortion occurring in a down-converter according to a level of a received RF (Radio Frequency) signal in a receiving stage of a mobile communication system, said receiving stage including a low-noise amplifier for low-noise amplifying an RF input signal received through an antenna and outputting the amplified received RF signal, said down-converter for down-converting the amplified received RF signal to an IF (Intermediate Frequency) signal by mixing the amplified received RF signal with a reference frequency signal, and an automatic gain control (AGC) amplifier for amplifying the IF signal according to an AGC voltage to maintain a power level of the IF signal and outputting the amplified IF signal for demodulation, said apparatus comprising:

a power detector for detecting a power level of the amplified received RF signal;

a comparator for comparing the detected power level with a predetermined reception power threshold and generating a comparison control voltage, said comparison control voltage being inversely proportional to a difference between the detected power level and the reception power threshold; and a voltage controlled amplifier for amplifying the reference frequency signal according to the generated comparison control voltage and outputting the amplified reference frequency signal to the down-converter.

2. The apparatus as claimed in claim 1, wherein the comparator generates the comparison control voltage for decreasing a level of the reference frequency signal, when the detected power level of the received RF signal is greater than or equal to the reception power threshold.

3. The apparatus as claimed in claim 1, wherein the reception power threshold is set to a power level of the received RF signal where bit error rate (BER) performance of demodulated received data is deteriorated.

4. An apparatus for reducing nonlinear distortion occurring in an AGC amplifier due to an increase in gain thereof when a power level of a transmission signal is high in a transmission stage of a mobile communication system, said transmission stage including the AGC amplifier for amplifying an IF transmission signal according to a transmission signal power level control voltage to maintain a power level of a modulated transmission signal, an up-converter for mixing an output signal of the AGC amplifier with a reference frequency signal to up-convert the IF transmission signal to an RF transmission signal, and a power amplifier for power amplifying the RF transmission signal and transmitting the amplified RF transmission signal, said apparatus comprising:

a comparator for comparing the transmission signal power level control voltage with a predetermined transmission power threshold and generating a comparison control voltage, said comparison control voltage being inversely proportional to a difference between the transmission signal power level control voltage and the predetermined transmission power threshold; and a voltage controlled amplifier for amplifying the reference frequency signal according to the generated comparison control voltage and outputting the amplified reference frequency signal to the up-converter.

5. The apparatus as claimed in claim 4, wherein the comparator generates the comparison control voltage for increasing a level of the reference frequency signal when the transmission signal power level control voltage is higher than or equal to the transmission power threshold.

6. The apparatus as claimed in claim 4, wherein the transmission power threshold is set to a power level of the transmission signal, where the output signals of the AGC amplifier are distorted.

7. An apparatus for reducing nonlinear distortion of transmission/reception signals in a mobile communication system having an AGC function, comprising:

an oscillator for oscillating a reference frequency signal;

a low-noise amplifier for low-noise amplifying an RF input signal received through an antenna and outputting a received RF signal;

a power detector for detecting a power level of the received RF signal;

a first comparator for comparing the detected power level of the received RF signal with a predetermined reception power threshold and generating a reception comparison control voltage being inversely proportional to a difference of said comparison;

a first voltage controlled amplifier for amplifying the reference frequency signal according to the reception comparison control voltage;

a down-converter for mixing the received RF signal with an output signal of the first voltage controlled amplifier to convert the received RF signal to an IF signal;

a reception AGC amplifier for amplifying the IF signal according to an AGC voltage to maintain a power level of the IF signal and outputting the amplified signal for demodulation;

a controller for determining the reception power threshold, a transmission power threshold and a transmission signal power level control voltage;

a transmission AGC amplifier for amplifying the demodulated transmission signal according to the transmission signal power level control voltage to maintain a power level of the demodulated transmission signal;

a second comparator for comparing the transmission signal power level control voltage with the transmission power threshold and generating a transmission comparison control voltage being inversely proportional to a difference of said comparison;

a second voltage controlled amplifier for amplifying the reference frequency signal according to the transmission comparison control voltage;

an up-converter for mixing an output of the transmission AGC amplifier with an output of the second voltage controlled amplifier to convert the output of the transmission AGC amplifier to an RF transmission signal; and a power amplifier for power amplifying the RF transmission signal and transmitting the amplified transmission signal through the antenna.

8. The apparatus as claimed in claim 7, wherein the first comparator generates the reception comparison control voltage for decreasing a level of the reference frequency signal, when the power of the received RF signal is higher than or equal to the reception power threshold.

9. The apparatus as claimed in claim 7, wherein the reception power threshold is set to a power value of the received RF signal at which BER performance of demodulated received data is deteriorated.

10. The apparatus as claimed in claim 7, wherein the second comparator generates the comparison control voltage for increasing a level of the reference frequency signal when the transmission signal power level control voltage is greater than or equal to the transmission power threshold.

11. The apparatus as claimed in claim 7, wherein the transmission power threshold is set to a power value of the transmission signal at which the output signals of the AGC amplifier are distorted.

12. A method for reducing nonlinear distortion occurring in a down-converter according to a level of a received RF signal in a receiving stage of a mobile communication system, said receiving stage including a low-noise amplifier for low-noise amplifying an RF input signal received through an antenna and outputting the received RF signal, said down-converter for down-converting the received RF signal to an IF signal by mixing the received RF signal with a reference frequency signal, and an AGC amplifier for amplifying the IF signal according to an AGC voltage to maintain power of the IF signal and outputting the amplified signal for demodulation, said method comprising the steps of:

detecting a power level of the received RF signal;

comparing the detected power level with a predetermined reception power threshold and generating a comparison control voltage being inversely proportional to a difference of said comparison; and voltage-controlled amplifying the reference frequency signal according to the generated comparison control voltage and outputting the amplified reference frequency signal to the down-converter.

13. The method as claimed in claim 12, wherein the comparison control voltage for decreasing a level of the reference frequency signal is generated when a power level of the received RF signal is higher than or equal to the reception power threshold.

14. The method as claimed in claim 12, wherein the reception power threshold is set to a power level of the received RF signal at which BER performance of demodulated received data is deteriorated.

15. A method for reducing nonlinear distortion occurring in an AGC amplifier due to an increase in gain thereof when a power level of a transmission signal is high in a transmission stage of a mobile communication system including the AGC amplifier for amplifying an IF transmission signal according to a transmission signal power level control voltage to maintain a power level of a modulated transmission signal, an up-converter for mixing an output signal of the AGC amplifier with a reference frequency signal to up-convert the IF signal to an RF signal, and a power amplifier for power amplifying the RF signal and transmitting the amplified RF signal, comprising the steps of:

comparing the transmission signal power level control voltage with a predetermined transmission power threshold and generating a comparison control voltage being inversely proportional to a difference of said comparison; and voltage-controlled amplifying the reference frequency signal according to the generated comparison control voltage and outputting the amplified reference frequency signal to the up-converter.

16. The method as claimed in claim 15, wherein the comparison control voltage for increasing a level of the reference frequency signal is generated when the transmission signal power level control voltage is higher than or equal to the transmission power threshold.

17. The method as claimed in claim 15, wherein the transmission power threshold is set to a power level of the transmission signal at which the output signals of the AGC amplifier are distorted.

* * * * *